United States Patent
Park et al.

(10) Patent No.: US 7,074,668 B1
(45) Date of Patent: Jul. 11, 2006

(54) CAPACITOR OF SEMICONDUCTOR DEVICE AND METHOD FOR FORMING THE SAME

(75) Inventors: Ki Seon Park, Kyoungki-do (KR); Jae Sung Roh, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/068,683

(22) Filed: Feb. 28, 2005

(30) Foreign Application Priority Data

Dec. 16, 2004 (KR) .................. 10-2004-0106830

(51) Int. Cl.
*H01L 21/8242* (2006.01)

(52) U.S. Cl. .............. 438/243; 438/244; 438/253; 438/387; 438/702; 438/703; 438/723

(58) Field of Classification Search ........... 438/239, 438/243, 244, 253, 386, 387, 696, 700, 702, 438/703, 706, 723, FOR. 220, FOR. 430
See application file for complete search history.

(56) References Cited

U.S. PATENT DOCUMENTS

| 5,770,098 A | * | 6/1998 | Araki et al. ............ 216/67 |
| 6,929,999 B1 | * | 8/2005 | Park et al. ............ 438/253 |
| 2001/0006834 A1 | * | 7/2001 | Hirota et al. .......... 438/244 |
| 2003/0235946 A1 | * | 12/2003 | Lee et al. ............. 438/243 |
| 2004/0217407 A1 | * | 11/2004 | Cho et al. ............. 257/306 |

* cited by examiner

*Primary Examiner*—George Fourson
*Assistant Examiner*—Joannie Adelle Garcia
(74) *Attorney, Agent, or Firm*—Ladas & Parry LLP

(57) ABSTRACT

In a method for forming a capacitor for use in a semiconductor device, a nitride film for stopping etching, a first mold oxide film, an insulating film, deposited on a substrate are etched to expose the respective storage node contacts and thereby to form a plurality of contact holes arrayed in a zigzag pattern for storage electrodes. A sacrificial oxide film is deposited by burying the contact holes for storage electrodes in a thickness such that an outer portion of the storage electrodes having a relatively short interval is completely buried while an outer portion the storage electrodes having a relatively long interval is not completely buried. The sacrificial oxide film and the insulation film are etched back to form a support network enclosing the respective storage electrodes and interconnected to each other.

15 Claims, 5 Drawing Sheets

CAPACITOR OF SEMICONDUCTOR DEVICE AND METHOD FOR FORMING THE SAME

BACKGROUND OF THE INVENTION

1. Field of the Invention

The present invention relates to a capacitor of a semiconductor device, and more particularly, to a capacitor capable of preventing a bridge from being produced between adjacent storage electrodes, and a method for forming the capacitor.

2. Description of the Prior Art

According to rapid increase in demand of semiconductor memory devices, various techniques have been proposed to form a capacitor having high capacitance. The capacitor is a structure in which a dielectric film is interposed between a storage electrode and a plate electrode. The capacitance of the capacitor is in proportion to a surface area of electrodes and a dielectric constant of a dielectric substance, but is in inverse proportion to an interval between electrodes.

Accordingly, in order to increase the capacitance of the capacitor, use of a dielectric film having a high dielectric constant and enlarged surface area of the electrode are demanded, and a shortened distance between the electrodes is also demanded. Since it is limited to shorten the distance between the electrodes (i.e., a thickness of the dielectric film), studies in forming the high-capacitance capacitor are mainly focused on a method of utilizing a dielectric film having a high dielectric constant or enlarging a surface area of an electrode. In particular, various methods of maximizing a surface area of the electrode have been going on in terms of structure.

A cylinder-type capacitor is in the spotlight as a structure to maximize the surface area of the electrode at present. The reason is because the cylinder-type capacitor may use an inner surface area and an outer surface area as the surface area of the electrode. As a result, the cylinder-type capacitor can obtain large capacitance in the same width, as compared with an existing concave-type capacitor. Also, a process of forming the cylinder-type capacitor is more easily performed.

According to a conventional method for forming the cylinder-type storage electrode, after a concave-type storage electrode is formed, a mold oxide film between electrodes is removed by wet etching (so-called 'dip-out' etching).

In spite of a reduced area of a cell, storage cell capacitance required for operation of a memory device should be maintained above 25 fF/cell for soft error prevention and refresh time constraint. Accordingly, in the cylinder-type capacitor, a height of the storage electrode is continuously increased to secure higher storage cell capacitance in the same surface area.

When forming the cylinder-type capacitor, the height of the storage electrode is increased and the interval between the adjacent storage electrodes is shortened, according to reduction of a design rule. In spite of optimization of the dip-out process, a bridge is produced between the storage electrodes by the results of dip-out process.

FIG. 1 shows the state in which a bridge is produced between storage electrodes after performing a dip-out process, in the case of forming a conventional TiN storage electrode in 100 nm design rule. It would be understood from FIG. 1 that a lot of bridges were produced between the TiN storage electrodes. It is expected that the bridge is more excessively produced between the adjacent storage electrodes in 70 nm design rule.

Finally, in order to properly cope with the reduction of the design rule at forming cylinder-type capacitor, it is very important to prevent the production of the bridge between the adjacent storage electrodes during the dip-out process.

SUMMARY OF THE INVENTION

Accordingly, the present invention has been made to solve the above-mentioned problems occurring in the prior art, and an object of the present invention is to provide a capacitor capable of preventing a bridge from being produced between adjacent storage electrodes as design rule is reduced, and a method for forming the capacitor.

Another object of the present invention is to provide a capacitor capable of embodying a highly integrated memory device by preventing a bridge from being produced between adjacent storage electrodes as design rule is reduced, and a method for forming the capacitor.

In order to accomplish this object, there is provided a capacitor for use in a semiconductor device, comprising: a semiconductor substrate with a lower structure containing a plurality of storage node contacts formed thereon; a plurality of cylinder-type storage electrodes each contacted with the respective storage node contact on the substrate and arrayed in a zigzag pattern; a support network enclosing the respective storage electrodes and interconnected to each other, in which an interval between the storage electrodes is constantly maintained; and a dielectric film and a plate electrode formed in turn on the respective storage electrodes.

Preferably, the support network is made of a nitride film.

According to another aspect of the present invention, there is provided a method for forming a capacitor for use in a semiconductor device, comprising the steps of: providing a semiconductor substrate with a lower structure containing a plurality of storage node contacts formed thereon; depositing a nitride film for stopping etching, a first mold oxide film, an insulating film for supporting electrodes, and a second mold oxide film on the substrate in turn; etching the second mold oxide film, the insulation film, the first mold oxide film, and the nitride film to expose the respective storage node contacts and thereby to form a plurality of contact holes arrayed in a zigzag pattern for storage electrodes; forming an storage electrode on a surface of the respective contact holes for storage electrode; removing the second mold oxide film; depositing a sacrificial oxide film by burying the contact holes for storage electrodes in a thickness such that an outer portion of the storage electrodes having a relatively short interval is completely buried while an outer portion the storage electrodes having a relatively long interval is not completely buried; etching back the sacrificial oxide film and the insulation film to form a support network enclosing the respective storage electrodes and interconnected to each other; removing the sacrificial oxide film and the first mold oxide film, which are remained on the substrate, through wet etching; and forming a dielectric film and a plate electrode in turn on cylinder-type storage electrodes of which an interval is constantly maintained by the support network.

Preferably, the first mold oxide film includes a PSG film and a PE-TEOS film, and is deposited in a thickness of 9000 to 11000 Å.

Preferably, the insulation film for supporting electrodes is a nitride film, and is deposited in a thickness of 100 to 500 Å through LPCVD or PECVD.

The second mold oxide film includes a PSG film and a PE-TEOS film, and is deposited in a thickness thicker than that of the insulation film for supporting electrodes, preferably 1900 to 2100 Å.

Preferably, the storage electrode is made of any one selected from a group consisting of a CVD TiN film, a CVD Ru film, an ALD TiN film, an ALD Ru film, an ALD Pt film, and an ALD Ir film. The storage electrode is made of CVD TiN film having a thickness 200 to 400 Å. Preferably, the TiN film is deposited at a temperature of 400 to 700° C. through a CVD process utilizing $TiCl_4$ as a source gas and $NH_3$ gas as a reactive gas.

Preferably, the sacrificial oxide film is made of an ALD $SiO_2$ film. The ALD $SiO_2$ film deposited in which $Si_2Cl_6$ is utilized as a source gas, $H_2O$ steam is utilized as a reactive gas, and pyridine is utilized as a catalysis material.

Preferably, the dielectric film includes a CVD $Ta_2O_5$ film, an ALD $Al_2O_3$ film, an ALD $TiO_2$ film, an ALD $HfO_2$ film, and an interlayer film thereof.

Preferably, the plate electrode includes a CVD TiN film, an ALD TiN film, an ALD Ru film, an ALD Pt film, and an ALD Ir film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
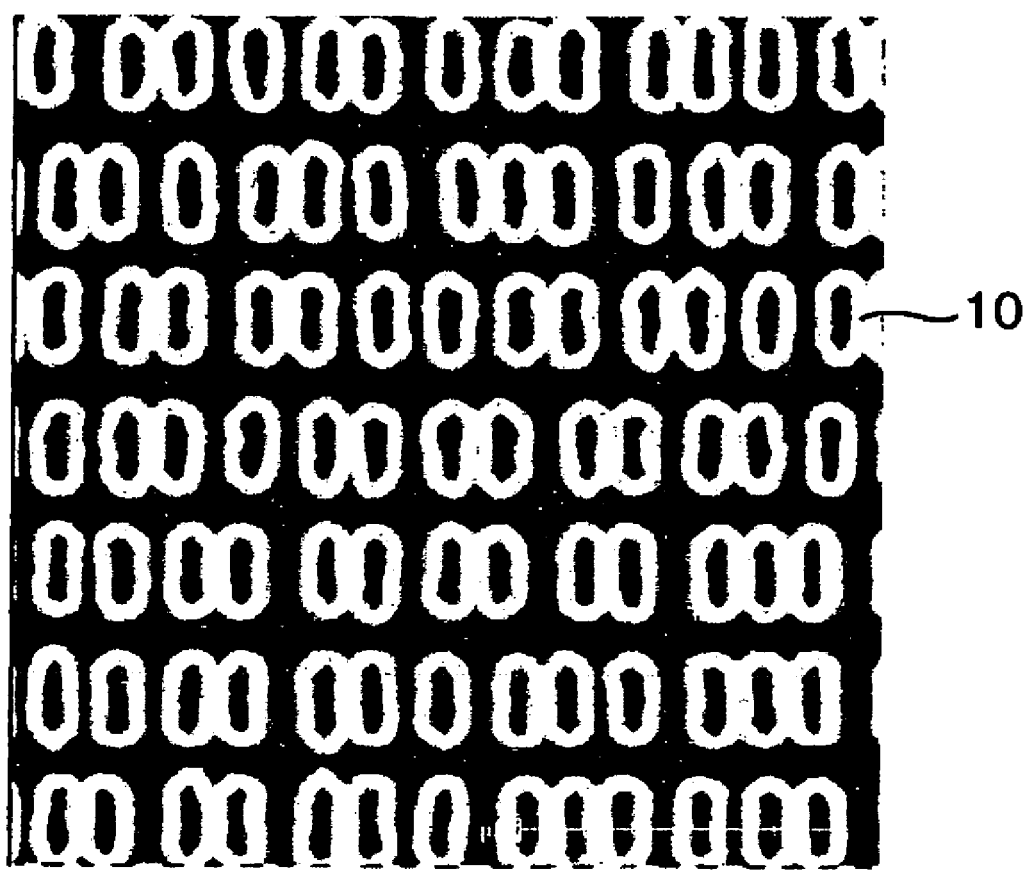
FIG. 1 is a microphotograph showing the state in which a bridge is produced between storage electrodes after performing a dip-out process, in the case of forming a conventional TiN storage electrode in 100 nm design rule.

Hereinafter, a preferred embodiment of the present invention will be described with reference to the accompanying drawings. In the following description and drawings, the same reference numerals are used to designate the same or similar components, and so repetition of the description on the same or similar components will be omitted.

Firstly explaining a technical feature of the present invention, the present invention forms a support network enclosing cylinder-type storage electrodes and interconnected to each other, which can prevent a bridge from being produced between the storage electrodes during a dip-out process.

More specifically, the present invention includes forming a mold oxide film as a layered structure of a first oxide film and a second oxide film on a substrate, forming an insulation film, e.g., a nitride film, between the first and second oxide films, etching the second oxide film, the nitride film and the first oxide film to define a position to form a storage electrode, forming storage electrodes of TiN, and etching the nitride film to form a nitride film network enclosing outer surfaces of the storage electrodes and interconnected to each other. Then, the substrate with the nitride film network formed thereon is subjected to a dip-out process to remove a mold oxide film. In this case, since an interval between the storage electrodes is constantly maintained by the nitride film network, a bridge is not produced between the adjacent storage electrodes during the dip-out process.

Accordingly, in the tendency to gradually increase a height of the electrode as design rule is decreased, the present invention can prevent the production of the bridge between the adjacent storage electrodes, which can embody a highly integrated memory device.

More specifically, a process of forming a capacitor in a semiconductor device according to the present invention will now be described with reference to FIGS. 2A through 3D depicting each steps of forming the capacitor.

Figure 2A:
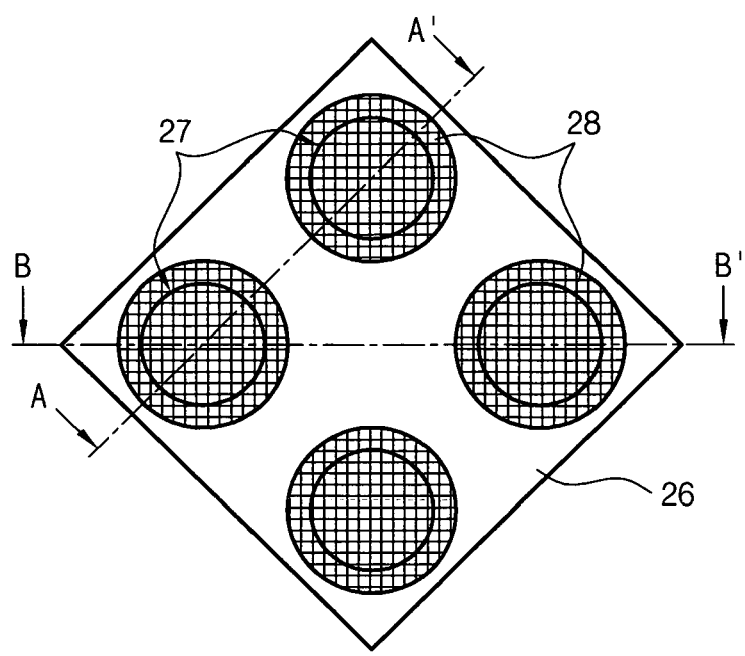
FIGS. 2A through 2D are plan views depicting a process of forming a capacitor in a semiconductor device according to an embodiment of the present invention.
Figure 3A:
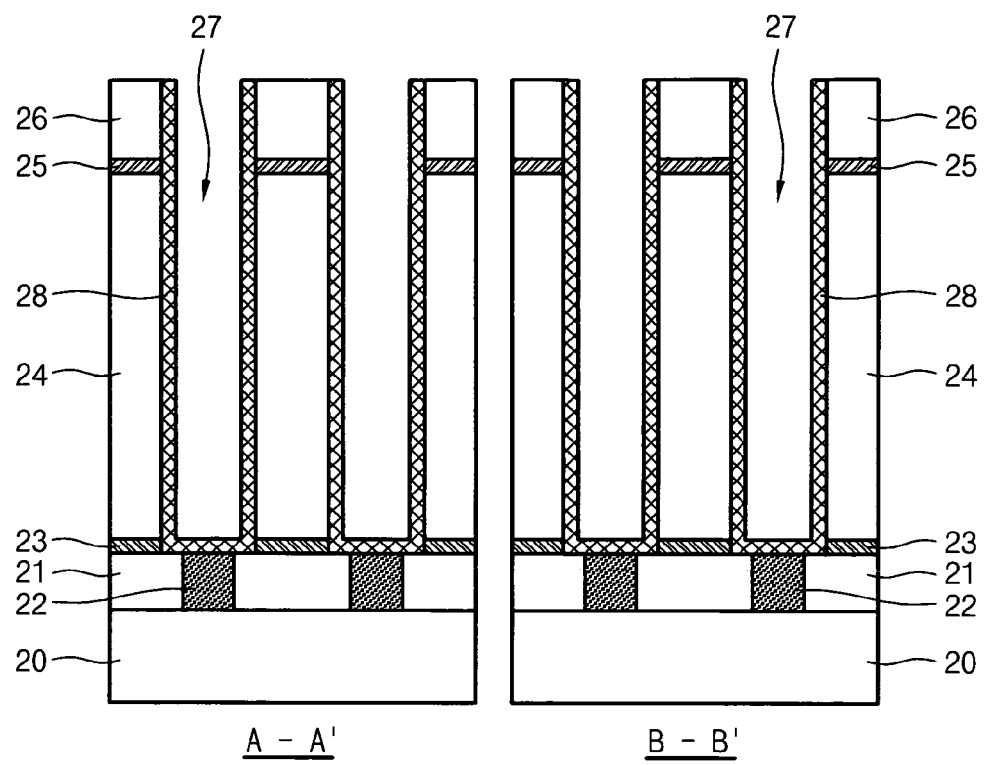
FIGS. 3A through 3D are cross-sectional views taken along lines A–A' and B–B' in FIGS. 2A through 2D.

Referring to FIGS. 2A and 3A, a lower structure (not shown) containing a bit line is formed on a substrate 20, and an interlayer insulation film 21 is formed on the entire surface of the lower structure to cover the lower structure. The interlayer insulation film 21 is etched to form contact holes, and a conductive film, e.g., tungsten, is buried in the contact holes to form a storage node contact 22. A USG film is utilized as the interlayer insulation film 21, and is deposited in a thickness of 1000 to 3000 Å. The storage node contact 22 is provided by depositing a Ti film in a thickness of about 50 Å and a TiN film in a thickness of about 100 Å, respectively, through a CVD process, depositing a tungsten film in a thickness of 1000 to 2000 Å, and then implementing chemical mechanical polishing (CMP) on the films. At that time, the CMP process may be replaced by an etch-back process.

A first nitride film 23 is deposited on the interlayer insulation film 21 containing the storage node contacts 22. A mold oxide film 24, a second nitride film 25 for supporting an electrode, and a second mold oxide film 26 are in turn deposited on the first nitride film 23. A PSG film is utilized as the first mold oxide film 24, and is deposited in a thickness of 9000 to 11000 Å, preferably 10000 Å. The second nitride film 25 is deposited in a thickness of 100 to 500 Å through LPCVD or PECVD. A PSG film is utilized as the second mold oxide film 26, and is deposited in a thickness thicker than that of the second nitride film 25, for example, 1900 to 2100 Å, preferably 2000 Å. As the first and second mold oxide films 24 and 26, the PSG film may be replaced by a PE-TEOS film.

The second mold oxide film 26, the second nitride film 25, and the first mold oxide film 24 are etched to form contact holes 27 for storage electrodes which expose the respective storage node contacts 22. The contact holes 27 are arrayed in a zigzag pattern, as shown in the accompanying drawings. At that time, in the drawings, an interval between adjacent contact holes along a line A–A' is wider than that between adjacent contact holes along a line B–B'.

A metal film, e.g., TiN film, is deposited on the second mold oxide film 26 containing the contact holes 27 for the storage electrodes as storage electrode material. At that time, the TiN film is deposited in a thickness of 200 to 400 Å at a temperature of 400 to 700° C. through a CVD process utilizing $TiCl_4$ as a source gas and $NH_3$ gas as a reactive gas. The storage electrode material may include a Ru film formed through a CVD process, and a TiN film (referred to as "ALD TiN film"), an ALD Ru film, an ALD Pt film and an ALD Ir film, formed through an atomic layer deposition (LLD) process.

An insulation film (not shown), such as photosensitive film and oxide film, is formed on the TiN film to bury the contact holes 27 for storage electrodes. After the insulation film is subjected to a CMP or etch-back process until the second mold oxide film 26 is exposed, the insulation film is removed to form a storage electrode 28 in the respective contact holes 27, the storage electrode being connected with the storage node contact 22 and separated from other storage electrode.

Figure 2B:
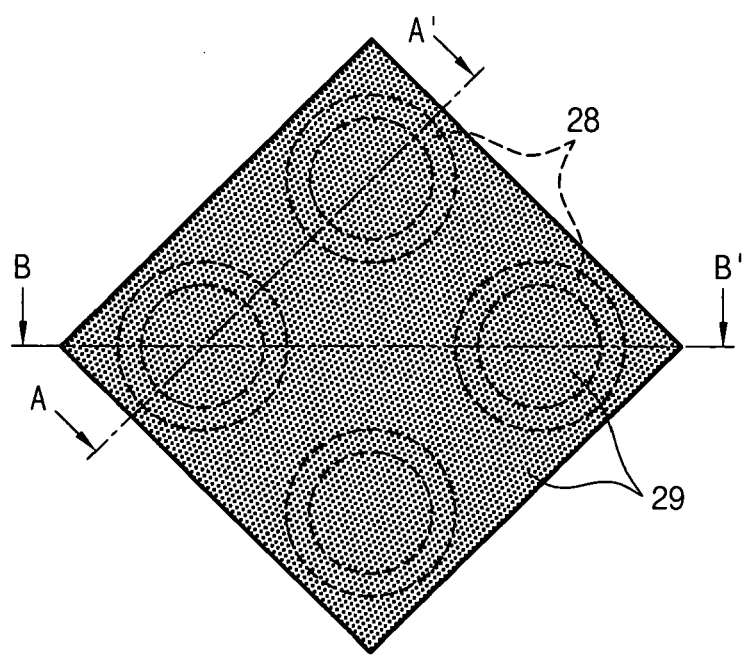
Figure 3B:
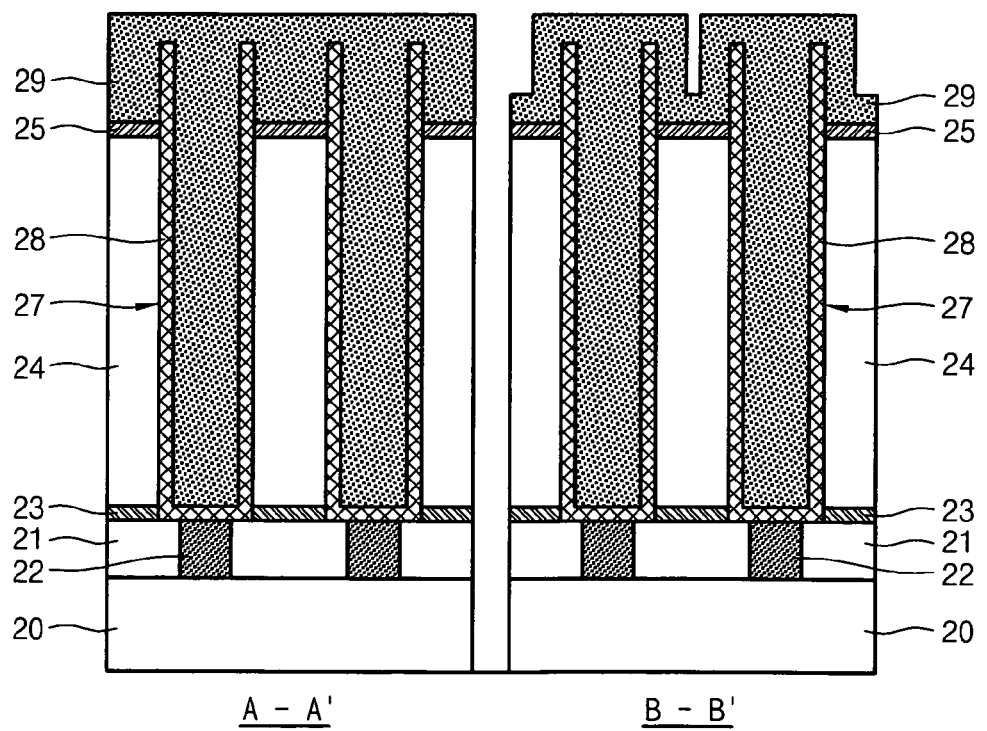

Referring to FIGS. 2B and 3B, the second mold oxide film is removed by use of an oxide film etchant such as BOE and HF. A sacrificial oxide film 29 is deposited on the substrate in a thickness sufficient for covering the storage electrode 28. As the sacrificial oxide film 29, a $SiO_2$ film (referred to as "ALD $SiO_2$ film") is deposited by use of an ALD process. At that time, $Si_2Cl_6$ is utilized as a source gas, $H_2O$ steam is utilized as a reactive gas, and pyridine is utilized as a catalysis material. When depositing the ALD $SiO_2$ film, the substrate is maintained in a temperature of about 100° C.

It is important for the sacrificial oxide film 29 of ALD $SiO_2$ to adjust a thickness of deposition thereof. Preferably, the sacrificial oxide film 29 of ALD $SiO_2$ is deposited in a minimum thickness sufficient for burying the contact holes 27 for storage electrodes in such a way that it is deposited in a thickness sufficiently for completely burying an outer portion in a direction of line A–A', while it is deposited in a thickness sufficiently for not completely burying an outer portion in a direction of line B–B'.

Figure 2C:
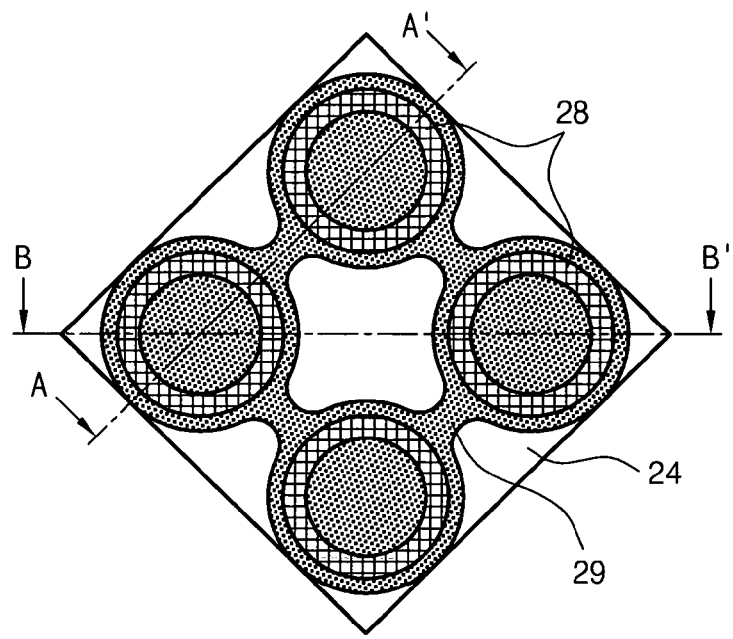
Figure 3C:
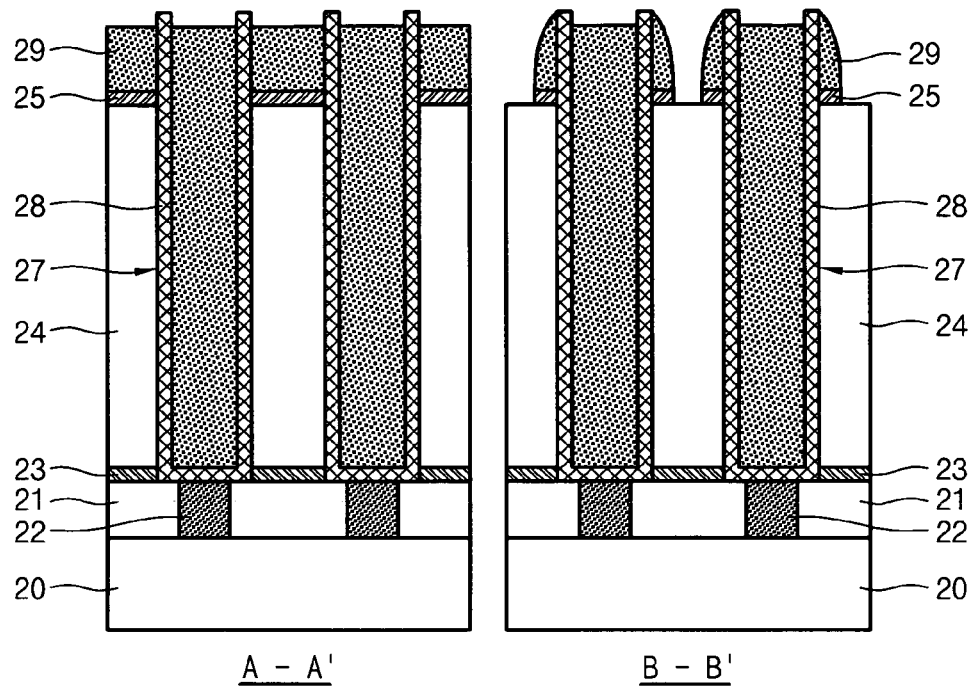

Referring to FIGS. 2C and 3C, the substrate is subjected to the etch-back process. At that time, in outer spaces of the contact holes 27 for storage electrode in a direction of line A–A' and in a direction perpendicular to the line A–A', the second nitride film is not etched back, since the sacrificial oxide film 29 serves as a barrier. In outer spaces of the contact holes 27 for storage electrode in a direction of line B–B', however, the second nitride film is etched back, as well as the sacrificial oxide film 29. As a result, provided is a support network enclosing outer surfaces of the storage electrodes 28 and interconnected to each other, i.e., nitride film network 25a.

Figure 2D:
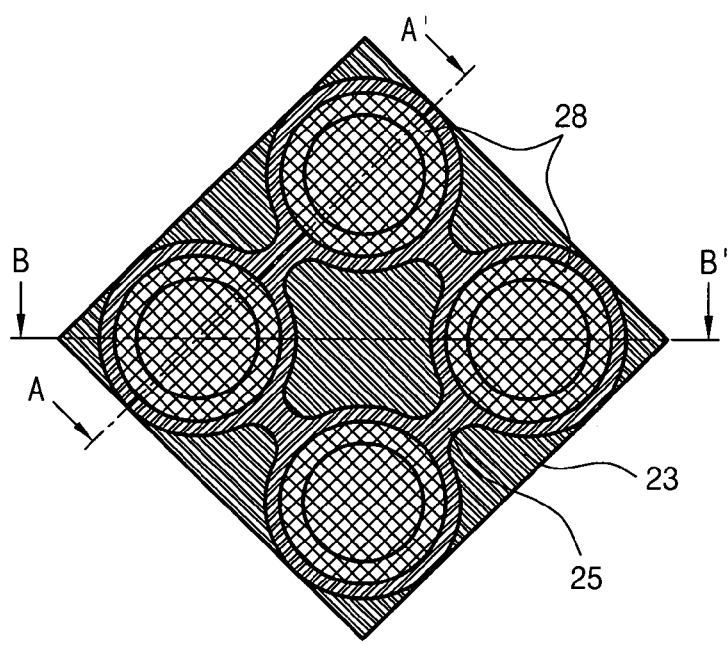
Figure 3D:
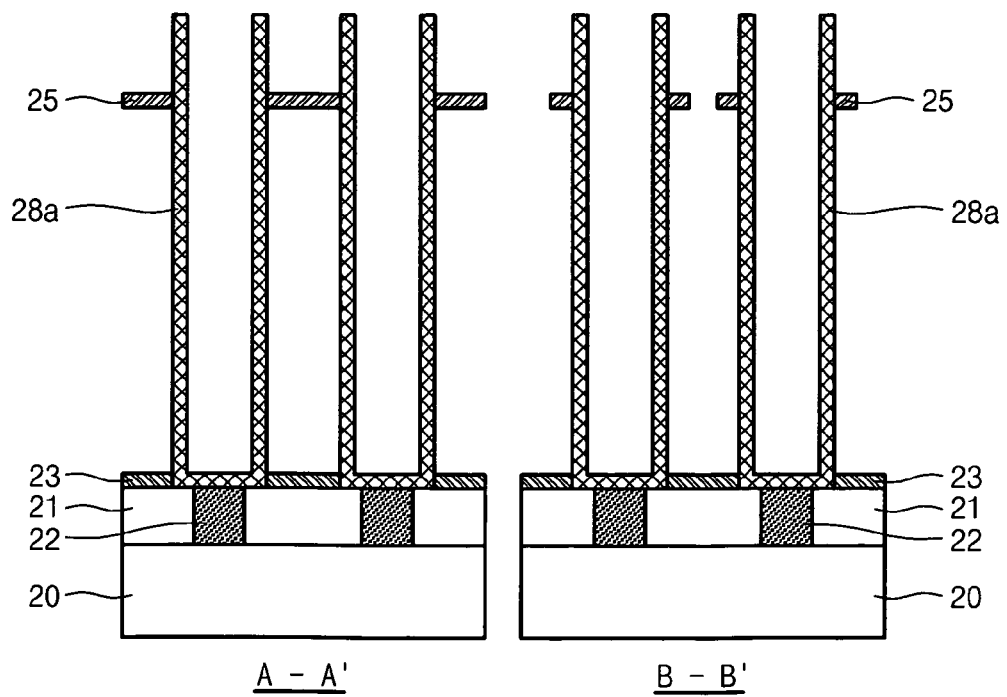

Referring to FIGS. 2D and 3D, the substrate is subjected to wet etching using an oxide film etchant such as BOE and HF, i.e., a dip-out process, which removes the sacrificial oxide film and the first mold oxide film to form a cylinder-type storage electrode 28a. At that time, the dip-out process is performed during a time required to completely remove the sacrificial oxide film and the first mold oxide film which are remained on the substrate.

Since the height of a storage electrode is increased according to reduction of design rule in a conventional memory device, a bridge is produced between adjacent storage electrodes during a dip-out process. In the present invention, the storage electrodes are maintained in a constant interval by the nitride film network 25a, thereby preventing the bridge from being produced between the adjacent cylinder-type storage electrodes 28a.

Although not shown in the accompanying drawings, a dielectric film and a plate electrode are in turn deposited on the cylinder-type storage electrodes 28a which are maintained in a constant interval, thereby completely forming a capacitor according to the present invention.

The dielectric film includes a CVD $Ta_2O_5$ film, an ALD $Al_2O_3$ film, an ALD $TiO_2$ film, an ALD $HfO_2$ film, and an interlayer film thereof. Also, the plate electrode includes a CVD TiN film, an ALD TiN film, an ALD Ru film, an ALD Pt film, and an ALD Ir film.

With the above description, according to the present invention, the dip-out process is implemented in the state where the support network encloses the outer surfaces of the storage electrodes and interconnected to each other, thereby maintaining the interval between the storage electrodes in a constant level thereby to prevent production of the bridge between the adjacent storage electrodes.

Therefore, in the tendency to gradually increase the height of the electrode as design rule is decreased, the present invention can prevent the production of the bridge between the adjacent storage electrodes, which can secure reliability of the memory device and embody a highly integrated memory device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a capacitor for use in a semiconductor device, comprising the steps of:
    providing a semiconductor substrate with a lower structure containing a plurality of storage node contacts formed thereon;
    depositing a nitride film for stopping etching, a first mold oxide film, an insulating film for supporting electrodes, and a second mold oxide film on the substrate in turn;
    etching the second mold oxide film, the insulating film, the first mold oxide film, and the nitride film to expose respective storage node contacts and thereby to form a plurality of contact holes arrayed in a zigzag pattern for storage electrodes;
    forming a storage electrode on a surface of respective contact holes for the storage electrode;
    removing the second mold oxide film;
    depositing a sacrificial oxide film burying the contact holes for the storage electrodes in a thickness of said sacrificial oxide film such that first outer portion of the storage electrodes is buried while another second outer portion of the storage electrodes is not completely buried by said sacrificial oxide film;
    etching back the sacrificial oxide film and the second nitride film to form a support network enclosing the respective storage electrodes and interconnected to each other;
    removing the sacrificial oxide film and the first mold oxide film, which are remained on the substrate, through wet etching; and
    forming a dielectric film and a plate electrode in turn on cylinder-type storage electrodes of which an interval is constantly maintained by the support network.

2. The method as claimed in claim 1, wherein the first mold oxide film includes a PSG film and a PE-TEOS film.

3. The method as claimed in claim 1, wherein the first mold oxide film is deposited in a thickness of 9000 to 11000 Å.

4. The method as claimed in claim 1, wherein the insulating film for supporting electrodes is a nitride film.

5. The method as claimed in claim 4, wherein the nitride film is deposited in a thickness of 100 to 500 Å through LPCVD or PECVD.

6. The method as claimed in claim 1, wherein the second mold oxide film includes a PSG film and a PE-TEOS film.

7. The method as claimed in claim 6, wherein the second mold oxide film is deposited in a thickness thicker than that of the insulating film for supporting electrodes.

8. The method as claimed in claim 7, wherein the second mold oxide film is deposited in a thickness of 1900 to 2100 Å.

9. The method as claimed in claim 1, wherein the storage electrode is made of any one selected from a group consisting of a CVD TiN film, a CVD Ru film, an ALD TiN film, an ALD Ru film, an ALD Pt film, and an ALD Ir film.

10. The method as claimed in claim 1, wherein the storage electrode is made of CVD TiN film having a thickness 200 to 400 Å.

11. The method as claimed in claim 10, wherein the TiN film is deposited at a temperature of 400 to 700° C. through a CVD process utilizing $TiCl_4$ as a source gas and $NH_3$ gas as a reactive gas.

12. The method as claimed in claim 1, wherein the sacrificial oxide film is made of an ALD $SiO_2$ film.

13. The method as claimed in claim 12, wherein the ALD $SiO_2$ film deposited in which $Si_2Cl_6$ is utilized as a source gas, $H_2O$ steam is utilized as a reactive gas, and pyridine is utilized as a catalysis material.

14. The method as claimed in claim 1, wherein the dielectric film includes a CVD $Ta_2O_5$ film, an ALD $Al_2O_3$ film, an ALD $TiO_2$ film, an ALD $HfO_2$ film, and an interlayer film thereof.

15. The method as claimed in claim 1, wherein the plate electrode includes a CVD TiN film, an ALD TiN film, an ALD Ru film, an ALD Pt film, and an ALD Ir film.

* * * * *